(12) United States Patent
Fujioka

(10) Patent No.: US 6,811,931 B1
(45) Date of Patent: Nov. 2, 2004

(54) PHOTOMASK ORIGINAL FORM HAVING LAYER FOR PROTECTING FILM SURFACE AND METHOD FOR PREPARING THE SAME, AND PROTECTIVE LAYER-FORMING LIQUID FOR PHOTOMASK ORIGINAL FORM

(75) Inventor: Akio Fujioka, Tokyo (JP)

(73) Assignee: Sineisha Co., Ltd., Tokyo (JP)

( * ) Notice: Subject to any disclaimer, the term of this patent is extended or adjusted under 35 U.S.C. 154(b) by 0 days.

(21) Appl. No.: 10/110,905

(22) PCT Filed: Oct. 20, 1999

(86) PCT No.: PCT/JP99/05800

§ 371 (c)(1),
(2), (4) Date: Apr. 18, 2002

(87) PCT Pub. No.: WO01/29615

PCT Pub. Date: Apr. 26, 2001

(51) Int. Cl.[7] .............................. G03F 9/00; G03C 5/00; G03C 1/492; G03C 1/76
(52) U.S. Cl. ........................ 430/5; 430/269; 430/271.1
(58) Field of Search ...................... 430/5, 270.1, 271.1, 430/269

(56) References Cited

U.S. PATENT DOCUMENTS 5,871,870 A * 2/1999 Alwan .......................... 430/5

FOREIGN PATENT DOCUMENTS

| JP | 08227144 | 9/1996 |
| JP | 102475 | 1/1998 |
| JP | 11305420 | 11/1999 |

OTHER PUBLICATIONS

Copy International Search Report for PCT/JP99/05800 listing references cited and provided above.

* cited by examiner

Primary Examiner—Saleha R. Mohamedulla
(74) Attorney, Agent, or Firm—Darby & Darby

(57) ABSTRACT

A photomask plate with a film surface protective layer is characterized in that a protective layer forming solution is prepared by mixing a main constituent comprising a two-liquid cross-linked antifouling surface coating agent, prepared by combining a mixed resin of a fluororesin and an acrylic resin in a solvent mixture of n-butyl acetate, methyl ethyl ketone (MEK) and methyl isobutyl ketone (MIBK), with a cross-linking curing agent, prepared by mixing a polyisocyanate prepolymer and ethyl acetate, and a diluent comprising n-butyl acetate, methyl ethyl ketone (MEK) and cellosolve (ethylene glycol monoethyl ether) acetate. This protective layer forming solution is applied to a film surface of a photomask plate photosensitive emulsion layer produced by forming the film surface of the photosensitive emulsion layer (an emulsion photomask) on a substrate. The protective layer forming solution is then aged to form a film surface protective layer in a laminated manner. The resulting inexpensive and durable photomask is protected from being soiled or marked while having minimal reduction in ultraviolet light transmittance.

10 Claims, 1 Drawing Sheet

PHOTOMASK ORIGINAL FORM HAVING LAYER FOR PROTECTING FILM SURFACE AND METHOD FOR PREPARING THE SAME, AND PROTECTIVE LAYER-FORMING LIQUID FOR PHOTOMASK ORIGINAL FORM

BACKGROUND OF THE INVENTION

1. Technical Field

Photo-fabrication processing is widely used as a micro-precision processing method necessary in the manufacture and formation of IC lead frames, color television shadow masks, high density printed circuit boards, miniature gears and the electrodes and partitions in thin displays (LCD-PDP). The present invention relates to a photomask plate having a film surface protective layer used in this type of photo-fabrication processing. The present invention further relates to a method of manufacturing such a photomask plate having a film surface protective layer. Additionally, the present invention relates to a solution for forming a film surface protective layer used in this type of photo-fabrication processing.

In the aforementioned photo-fabrication processing, the surface to be treated is covered with a corrosion resistant film, which is then partially removed.

Next, photo-etching methods are used to chemically dissolve and remove the exposed surface. Optionally, photo-electroforming methods are used to grow a metal by electroforming.

In both of these methods, the portions of the surface which are not to be processed are covered with a corrosion resistant film, so that the processing is performed subsequent to a masking process. The masking process is typically a photographic method in which a precision made photographic image is superimposed on a photomask made of a photosensitive material which has photosensitivity to ultraviolet light. The photomask is then exposed, developed and dried. Almost all of the photomask plates used in this type of photographic method are emulsion photomasks, formed by adhering a photosensitive emulsion layer in a film state, comprising gelatin or the like as the main constituent, to the surface of a substrate.

The present invention relates to technology for forming a film surface protective layer for protecting a photomask, and in particular an emulsion photomask, of a photomask plate.

2. Background Art

Conventional photomask plates are manufactured using a CAD system, or the like, to prepare data for an exposure apparatus (such as a photo-plotter) based on a target blueprint or data Then, this data is used to perform direct writing of a pattern onto an emulsion photographic dry plate. Finally, the photographic dry plate with the pattern drawn thereon is developed, fixed, washed in water, dried, retouched, and examined.

A conventional photomask plate emulsion photomask (a film surface of a photosensitive emulsion layer), formed in this manner, comprises gelatin or the like as the main constituent. Thus, the film surface is soft and easily marked. Furthermore, other problems also exist. For example, if soiling, such as that resulting from a fingerprint, adheres to the film surface of the photomask, then subsequent removal of the soiling is difficult.

A first method of resolving this problem involves laminating an approximately $8\mu$~$12\mu$ film as a protective film onto the film surface of the photomask. However, this laminated protective film method suffers from poor sensitivity, as passage through the protective film reduces the transmittance of the ultraviolet light to approximately 50%.

A second method involves replacing the photosensitive emulsion film (emulsion photomask) with a metal film containing chromium (Cr900A) which is formed in a pattern on the surface of a glass substrate (a chrome mask) as the photomask. Chrome masks, however, are extremely expensive (between four and five times the cost of an emulsion photomask) and, consequently, suffer from being somewhat impractical.

OBJECTS AND SUMMARY OF THE INVENTION

It is an object of the present invention to provide a photomask which overcomes the foregoing problems.

It is an object of the present invention is to provide a cheap and durable photomask, by forming a second protective layer on top of an emulsion photomask produced by conventional methods. This object of the present invention overcomes the problems of the photomask being easily marked or easily soiled. Moreover, reductions in ultraviolet light transmittance, such as those observed for laminated protective films, are prevented.

Briefly stated, the present invention provides a photomask plate with a film surface protective layer characterized in that a protective layer forming solution is prepared by mixing a main constituent comprising a two-liquid cross-linked antifouling surface coating agent, prepared by combining a mixed resin of a fluororesin and an acrylic resin in a solvent mixture of n-butyl acetate, methyl ethyl ketone (MEK) and methyl isobutyl ketone (MIBK), with a cross-linking curing agent, prepared by mixing a polyisocyanate prepolymer and ethyl acetate, and a diluent comprising n-butyl acetate, methyl ethyl ketone (MEK) and cellosolve (ethylene glycol monoethyl ether) acetate. This protective layer forming solution is applied to a film surface of a photomask plate photosensitive emulsion layer produced by forming the film surface of the photosensitive emulsion layer (an emulsion photomask) on a substrate. The protective layer forming solution is then aged to form a film surface protective layer in a laminated manner. The resulting inexpensive and durable photomask is protected from being soiled or marked while having minimal reduction in ultraviolet light transmittance.

According to a first embodiment of the present invention, there is provided a photomask plate with a film surface protective layer, wherein a protective layer forming solution prepared by combining and mixing a mixed resin solution, comprising a fluororesin and an acrylic resin as the main constituents, and a mixed solution, comprising a polyisocyanate prepolymer as the main constituent, is applied to a film surface of a photomask plate photosensitive emulsion layer produced by forming the film surface of the photosensitive emulsion layer (an emulsion photomask) on a substrate. The protective layer forming solution is then aged to form a two-liquid cross-linked film surface protective layer in a laminated manner.

This first embodiment of the present invention is characterized by the formation of a two-liquid cross-linked film surface protective layer as a second layer on the surface of a typical photomask plate produced by forming a photosensitive emulsion layer (an emulsion photomask) on a substrate. The two-liquid cross-linked film surface protective layer is a two-liquid cross-linked synthetic resin film surface protective layer produced by chemical curing when a mixed resin solution, comprising a fluororesin and an acrylic resin, and a mixed solution, comprising a polyisocyanate prepolymer as the main constituent, are mixed together and then aged. The film surface protective layer displays excellent adhesion, forms a highly durable coating on a wide variety of soft and hard materials including acrylic resins, vinyl chloride, urethane resins and glass, is a colorless and transparent liquid, displays little tendency to whiten under bending or stretching, and produces almost no reduction in the transmittance of ultraviolet light. These properties make the film surface protective layer ideal for protecting a photomask plate.

According to a second embodiment of the present invention there is provided a photomask plate with a film surface protective layer, wherein a protective layer forming solution is prepared by mixing a main constituent, comprising a two-liquid cross-linked antifouling surface coating agent prepared by combining a mixed resin of a fluororesin and an acrylic resin in a solvent mixture of n-butyl acetate, methyl ethyl ketone (MEK) and methyl isobutyl ketone (MIBK), with a cross-linking curing agent, prepared by mixing a polyisocyanate prepolymer and ethyl acetate, and a diluent comprising n-butyl acetate, methyl ethyl ketone (MEK) and cellosolve (ethylene glycol monoethyl ether) acetate. The resulting protective layer forming solution is applied to a film surface of a photomask plate photosensitive emulsion layer produced by forming the film surface of the photosensitive emulsion layer (an emulsion photomask) on a substrate. The protective layer forming solution is then aged to form a film surface protective layer in a laminated manner.

This second embodiment of the present invention includes a photomask plate with a film surface protective layer in which a two-liquid cross-linked antifouling surface coating agent (a main constituent) and a cross-linking curing agent are each dissolved in a predetermined solvent. These two solutions, together with a diluent which is added to enable the two solutions to be diluted as required and applied as a thin film as well as enable easier control of the rate of chemical change, generate a new photomask protective layer forming solution. This protective layer forming solution is applied and then aged to form a practical film surface protective layer. In other words, the second embodiment of the present invention is characterized by the formation, on a photosensitive emulsion layer of a conventional photomask plate, of a film surface protective layer as a second layer by application of a protective layer forming solution, where the film surface protective layer improves the durability of the photomask with very little loss of functionality thereof. The two-liquid cross-linked antifouling surface coating agent, which is the main constituent of the film surface protective layer forming solution, is a two-liquid cross linked type surface coating agent with excellent adhesion properties, which is produced by forming a resin solution of a fluororesin and an acrylic resin dissolved in a solvent, and which forms a highly durable coating on a wide variety of soft and hard materials including acrylic resins, vinyl chloride, urethane resins and glass, and is a colorless and transparent liquid which displays little tendency to whiten under bending or stretching, and produces almost no reduction in the transmittance of ultraviolet light.

Furthermore, the cross-linking curing agent is a mixed solution prepared by dissolving a polyisocyanate prepolymer (structural formula: a trimethylolpropane adduct of hexamethylene diisocyanate) in a solvent. The cross-linking curing agent displays good transparency, and, when mixed with the main constituent, undergoes a reaction to generate cross-linking while curing to form a highly transparent film.

The aforementioned protective layer forming solution is a mixture of a main constituent, comprising a two-liquid cross-linked surface coating agent, prepared by dissolving the aforementioned resin mixture in a solvent to form a resin solution, to which a cross-linking curing agent and a diluent are added. None of the used solvent or diluent will remain by the completion of the aging process. Thus, the two-liquid cross-linked film surface protective layer formed will display the properties of the main constituent and the cross-linking curing agent. Consequently, a photomask plate with a film surface protective layer according to the present invention will be a low cost yet durable photomask which is not easily marked or soiled, and which does not reduce the transmittance of ultraviolet light.

According to a third embodiment of the present invention, there is provided a photomask plate with a film surface protective layer, wherein a protective layer forming solution is prepared by mixing 25~50% of a main constituent, comprising a two-liquid cross-linked antifouling surface coating agent prepared by combining a mixed resin of a fluororesin and an acrylic resin in a solvent mixture of n-butyl acetate, methyl ethyl ketone (MEK) and methyl isobutyl ketone (MIBK), with 1~6% of a cross-linking curing agent, prepared by mixing a polyisocyanate prepolymer and ethyl acetate, and 46~75% of a diluent comprising n-butyl acetate, methyl ethyl ketone (MEK) and cellosolve (ethylene glycol monoethyl ether) acetate. The resulting protective layer forming solution is applied to a film surface of a photomask plate photosensitive emulsion layer produced by forming the film surface of an emulsion layer (an emulsion photomask) on a substrate. The protective layer forming solution is then chemically altered to form a film surface protective layer.

According to a feature of this third embodiment of the present invention, by specifying the respective proportions in the mixture of the main constituent, the cross-linking curing agent and the diluent which constitute the protective layer forming solution, enables the implementation of a more favorable photomask plate with a film surface protective layer.

According to a fourth embodiment of the present invention, there is provided a photomask plate with a film surface protective layer according to either the second or the third embodiments, above, wherein the two-liquid cross-linked antifouling surface coating agent, as the main constituent of the protective layer forming solution, is a mixed resin solution comprising a mixed resin of 5~20% of a fluororesin and 10~30% of an acrylic resin in a solvent mixture comprising 20~30% n-butyl acetate, 30~40% methyl ethyl ketone (MEK) and 5~10% methyl isobutyl ketone (MIBK). The cross-linking curing agent is a mixed solution comprising 70~80% of a polyisocyanate prepolymer and 20~30% ethyl acetate, and the diluent is a mixed solution comprising 10~20% n-butyl acetate, 50~60% methyl ethyl ketone (MEK) and 25~40% cellosolve (ethylene glycol monoethyl ether) acetate.

This fourth embodiment of the present invention specifies the respective proportions of the main constituent, the cross-linking curing agent and the diluent which constitute the protective layer forming solution, as well as the proportions of the materials which are mixed to produce the above constituents. This enables the implementation of a more favorable photomask plate with a film surface protective layer.

According to a fifth embodiment of the present invention, there is provided a method of manufacturing a photomask plate with a film surface protective layer, wherein a protective layer forming solution is prepared by mixing a main constituent, comprising a two-liquid cross-linked antifouling surface coating agent prepared by combining a mixed resin of a fluororesin and an acrylic resin in a solvent mixture of n-butyl acetate, methyl ethyl ketone (MEK) and methyl isobutyl ketone (MIBK), with a cross-linking curing agent, prepared by mixing a polyisocyanate prepolymer and ethyl acetate, and a diluent comprising n-butyl acetate, methyl ethyl ketone (MEK) and cellosolve (ethylene glycol monoethyl ether) acetate. The protective layer forming solution is applied using an application method such as dip coating, spin coating, roll coating or spray coating to a film surface of a photomask plate photosensitive emulsion layer, which is produced by preparing an emulsion photographic dry plate by forming a film surface of a photosensitive emulsion layer (an emulsion photomask) on a substrate. A pattern is rendered and development treatment, such as developing, fixing, washing in water, and drying, is performed. Finally, the film surface is inspected and retouched, and the protective layer forming solution is then aged to form a film surface protective layer.

The fifth embodiment of the present invention is a method of manufacturing a photomask plate with a film surface protective layer. By application of a predetermined protective layer forming solution onto a prepared photomask plate, and subsequent aging, a film surface protective layer is formed through chemical change and drying. A variety of methods of application are available such as spray coating, spin coating, dip coating or roll coating, and any of these methods is suitable. However, from a practical viewpoint, in order to form a uniform film of only several microns in thickness, the use of spray coating is preferable. A method of manufacturing a photomask plate with a film surface protective layer, according to the present invention, includes preparing and uniformly applying a suitable protective layer forming solution. As a result, the surface quality of the film is good and a thin film surface protective layer is generated naturally. Thus, operations such as final polishing treatment are unnecessary, and consequently the manufacturing process is simplified.

According to a sixth embodiment of the present invention, there is provided a protective layer forming solution for a photomask plate, wherein a main constituent comprising a two-liquid cross-linked antifouling surface coating agent, prepared by combining a mixed resin of a fluororesin and an acrylic resin in a solvent mixture of n-butyl acetate, methyl ethyl ketone (MEK) and methyl isobutyl ketone (MIBK), is combined and mixed with a cross-linking curing agent, prepared by mixing a polyisocyanate prepolymer and ethyl acetate, and a diluent comprising n-butyl acetate, methyl ethyl ketone (MEK) and cellosolve (ethylene glycol monoethyl ether) acetate.

According to a seventh embodiment of the present invention, there is provided a protective layer forming solution for a photomask plate in which a main constituent two-liquid cross-linked antifouling surface coating agent is a mixed resin solution formed by combining a mixed resin of 5~20% of a fluororesin and 10~30% of an acrylic resin with a solvent mixture comprising 20~30% n-butyl acetate, 30~40% methyl ethyl ketone (MEK) and 5~10% methyl isobutyl ketone (MIBK). A cross-linking curing agent is a mixed solution comprising 70~80% of a polyisocyanate prepolymer and 20~30% ethyl acetate, and a diluent is a mixed solution comprising 10~20% n-butyl acetate, 50~60% methyl ethyl ketone (MEK) and 25~40% cellosolve (ethylene glycol monoethyl ether) acetate. These constituents are combined and mixed in a ratio of 25~50% of the main constituent, 1~6% of the cross-linking curing agent, and 46~75% of the diluent.

A feature of the seventh embodiment of the present invention specifies in more detail the components of the main constituent, the cross-linking curing agent and the diluent which constitute the protective layer forming solution, as well as the respective proportions of each of the materials incorporated therein. This enables the implementation of a more favorable photomask plate with a film surface protective layer.

The above, and other objects, features and advantages of the present invention will become apparent from the following description read in conjunction with the accompanying drawing, in which like reference numerals designate the same elements.

DETAILED DESCRIPTION OF THE INVENTION

Figure 1:
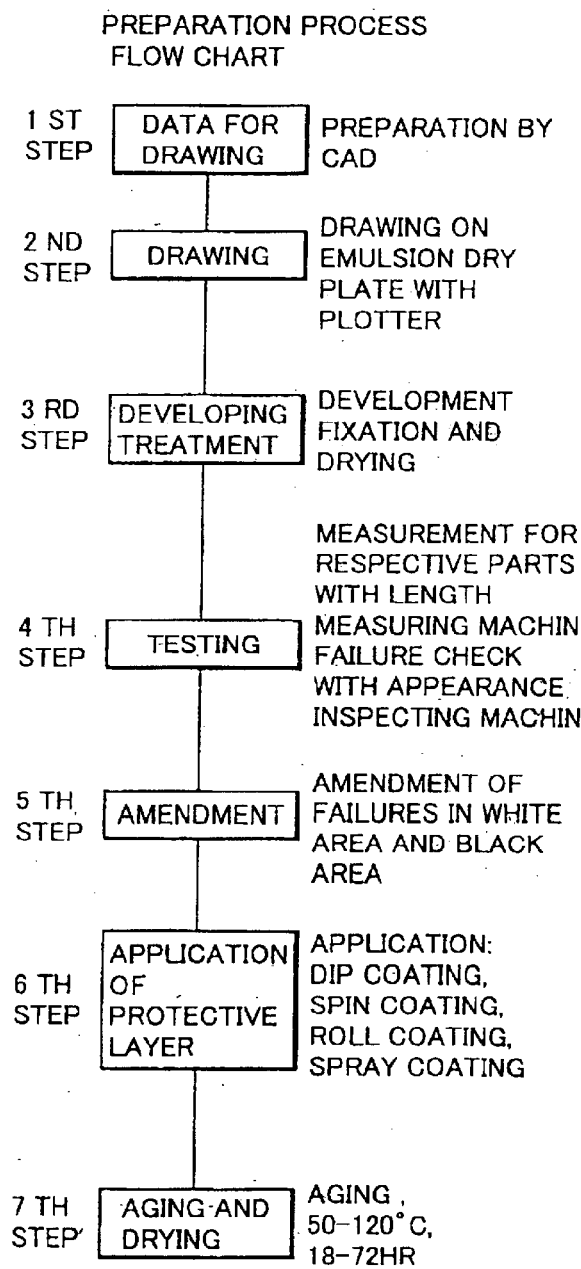
FIG. 1 is a flowchart showing a manufacturing process for a photomask plate with a film surface protective layer according to the present invention.

Hereinafter, the present invention will be explained in detailed based on an embodiment shown in the drawings.

Figure 2:
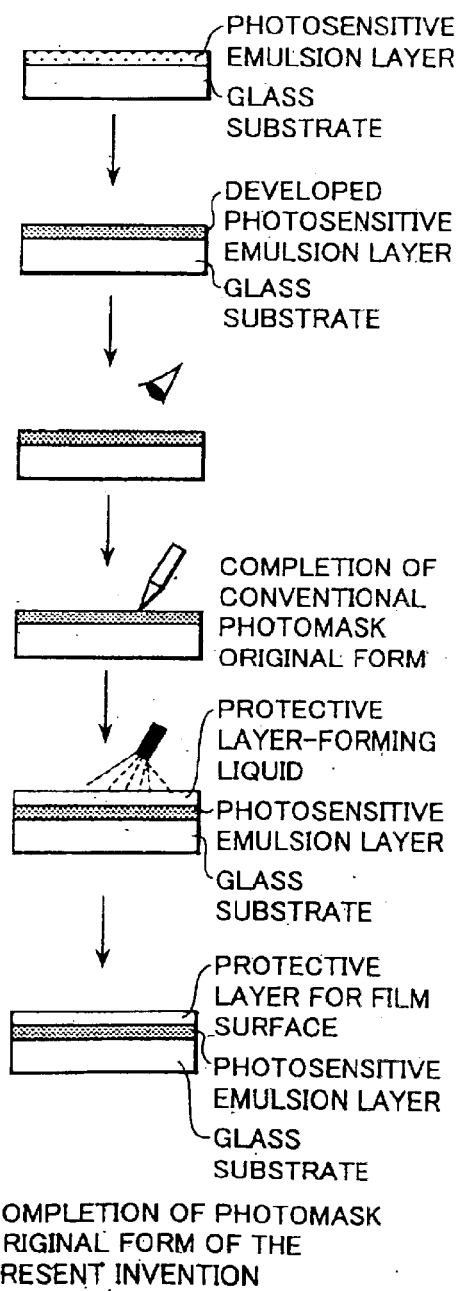
FIG. 2 is an explanatory diagram showing structural alterations accompanying the progression of the manufacturing process for a photomask plate with a film surface protective layer according to the present invention.

Referring to FIGS. 1 and 2, in a first step, a CAD system is used to prepare data for an exposure apparatus (such as a photo-plotter), based on data or a blueprint supplied by a client.

In a second step, a plotter is used to draw a pattern based on the aforementioned data onto an emulsion photographic dry plate which has been produced by forming a film surface of a photosensitive emulsion layer (emulsion photomask) on a glass substrate.

In a third step, the emulsion dry plate with the pattern drawn thereon undergoes development treatment such as developing, fixing, washing in water, and drying.

In a fourth step, each section is measured using a length measuring machine, and a defect examination is conducted using a visual examination device.

In a fifth step, retouching of white and black defects is performed. In conventional processes, the photomask plate is complete at this point.

In a sixth step of the present invention, a protective layer forming solution is applied to the photomask plate, which is the photographic plate. A film surface protective layer is formed in a laminated manner.

The protective layer forming solution is a solution in which a main constituent two-liquid cross-linked antifouling surface coating agent is a mixed resin solution formed by combining a mixed resin of 5~20% of a fluororesin and 10~30% of an acrylic resin with a solvent mixture comprising 20~30% n-butyl acetate, 30~40% methyl ethyl ketone (MEK) and 5~10% methyl isobutyl ketone (MIBK). The cross-linking curing agent is a mixed solution comprising 70~80% of a polyisocyanate prepolymer and 20~30% ethyl acetate. The diluent is a mixed solution comprising 10~20% n-butyl acetate, 50~60% methyl ethyl ketone (MEK) and 25~40% cellosolve (ethylene glycol monoethyl ether) acetate. These constituents are combined and mixed in a ratio of 25~50% of the aforementioned main constituent, 1~6% of the aforementioned cross-linking curing agent, and 46~75% of the diluent.

A detailed composition of a preferred protective layer forming solution is shown in Table 1.

TABLE 1

|  | Main Constituent | | Curing Agent | | Diluent | |
|---|---|---|---|---|---|---|
| Resin | Fluoro-resin | 5~20% | Polyiso-cyanate pre-polymer | 70~80% | | |
| | Acrylic resin | 10~30% | | | | |
| Solvent | n-butyl acetate | 20~30% | Ethyl acetate | 20~30% | n-butyl acetate | 10~20% |
| | MEK | 30~40% | | | MEK | 50~60% |
| | MIBK | 5~10% | | | Cellosolve acetate | 25~40% |
| Concentration of Solids | 30~33% | | | | | |
| Proportion of Composition | 25%~50% | | 1%~6% | | 46%~75% | |

Sample compositions of the protective layer forming solution according to the embodiment were prepared in the manner described below.

EXAMPLE 1

| Main constituent | | 100 g |
|---|---|---|
| (composition) | fluororesin | 10~20% |
| | acrylic resin | 10~20% |
| | methyl ethyl ketone (MEK) | 30~40% |
| | methyl isobutyl ketone (MIBK) | 5~10% |
| | n-butyl acetate | 20~30% |
| Cross-linking curing agent | | 6 g |
| (composition) | polyisocyanate prepolymer | 70~80% |
| | ethyl acetate | 20~30% |
| Diluent | | 300 g |
| (composition) | methyl ethyl ketone | 50~60% |
| | n-butyl acetate | 10~20% |
| | cellosolve (ethylene glycol monoethyl ether) acetate | 25~40% |

EXAMPLE 2

| Main constituent | | 100 g |
|---|---|---|
| (composition) | fluororesin | 5~10% |
| | acrylic resin | 20~30% |
| | methyl ethyl ketone | 30~40% |
| | methyl isobutyl ketone | 5~10% |
| | n-butyl acetate | 20~30% |
| Cross-linking curing agent | | 3 g |
| (composition) | polyisocyanate prepolymer | 70~80% |
| | ethyl acetate | 20~30% |
| Diluent | | 400 g |
| (composition) | methyl ethyl ketone | 50~60% |
| | n-butyl acetate | 10~20% |
| | cellosolve (ethylene glycol monoethyl ether) acetate | 25~40% |

Furthermore, any of a variety of application methods, such as spray coating, spin coating, dip coating or roll coating, can be used as the method of forming the film surface protective layer, as shown in Table 2. In the present embodiment, spray coating was used.

The chemical formulae or structural formulae of the substances constituting the aforementioned protective layer forming solution are as shown below.

TABLE 2

| Name of Substance | Chemical formula or structural formula |
|---|---|
| fluororesin | — |
| acrylic resin | — |
| polyisocyanate prepolymer | trimethylolpropane adduct of hexamethylene diisocyanate |
| methyl ethyl ketone (MEK) | $C_4H_8O$ |
| methyl isobutyl ketone (MIBK) | $C_6H_{12}O$ |
| n-butyl acetate | $C_6H_{12}O_2$ |
| ethyl acetate | $CH_3COOC_2H_5$ |
| cellosolve acetate | $CH_3COOCH_2CH_2OC_2H_5$ |

TABLE 3

| Application method | (1) Maximum size/(2) Application thickness, (3) Flatness |
|---|---|
| Spray coating | (1) no more than 800 × 1350 m/m |
| | (2) 1~2 $\mu$m |
| | (3) good |
| Spin coating | (1) no more than 500 × 600 m/m |
| | (2) 1~2 $\mu$m |
| | (3) very good |
| Dip coating | (1) no more than 500 × 600 m/m |
| | (2) 3~8 $\mu$m |
| | (3) good |
| Roll coating | (1) no more than 600 × 800 m/m |
| | (2) 5~10 $\mu$m |
| | (3) satisfactory |

In a seventh step, the film surface protective layer is aged while being dried at a temperature of 50~120° C. for a period of 18~72 hours. This completes the formation of the photomask plate with a film surface protective layer.

Experiments were conducted to compare the properties of a photomask plate with a film surface protective layer prepared in this manner, with a conventional photomask plate. The results of the experiments are shown in Table 4.

TABLE 4

| | Emulsion | Laminate | Present Invention | Chrome mask | Test method |
|---|---|---|---|---|---|
| Pencil hardness | 4~3B | 2~B | F~H | 5H | JIS-5400 |
| Antifouling property | X | Δ | ○ | ○ | Mark from felt-tipped pen wiped off with ethanol |
| Wrapping test ethanol | 10> | 20> | 100< | 100< | Rubbed with paper towel |
| Adhesion | ○ | Δ | ○ | ○ | Cellophane adhesive tape peeling test |
| UV transmittance | 84% | 60% | 84% | 90% | 365 nm |
| Film thickness | | 8~10$\mu$ | 1~2$\mu$ | | |

(1) Emulsion: A conventional emulsion photographic dry plate with no additional processing
(2) Laminate: An emulsion photographic dry plate with a protective film laminated thereon
(3) Chrome mask: A metallic film (Cr900A) used to form a pattern on top of a glass substrate Industrial Applicability The present invention provides a photomask plate with a film surface protective layer, wherein a protective layer forming solution, prepared by mixing a main constituent comprising a two-liquid cross-linked antifouling surface coating agent prepared by combining a mixed resin of a fluororesin and an acrylic resin in a solvent mixture of n-butyl acetate, methyl ethyl ketone (MEK) and methyl isobutyl ketone (MIBK), with a cross-linking curing agent prepared by mixing a polyisocyanate prepolymer and ethyl acetate, and a diluent comprising n-butyl acetate, methyl ethyl ketone (MEK) and cellosolve (ethylene glycol monoethyl ether) acetate, is applied to a film surface of a photomask plate photosensitive emulsion layer produced by forming the film surface of the photosensitive emulsion layer (an emulsion photomask) on a substrate, and the protective layer forming solution is then aged to form a film surface protective layer, and also provides a method of manufacturing the photomask plate with a film surface protective layer, and a protective layer forming solution for a photomask plate.

The protective layer forming solution displays good adhesion, forms a thin film with excellent durability, is a colorless and transparent liquid, displays little tendency to whiten under bending or stretching, and produces almost no reduction in the transmittance of ultraviolet light. As a result, a photomask plate with a film surface protective layer formed by application of the protective layer forming solution and subsequent being aged, is a low cost yet durable photomask plate which is not easily marked or soiled, and which does not reduce the transmittance of ultraviolet light, and is consequently very useful.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A photomask with a film surface protective layer, comprising:

a substrate;

a photomask plate photosensitive emulsion layer on said substrate; said photomask plate photosensitive emulsion layer being produced by forming a film surface of said photomask plate photosensitive emulsion layer on said substrate; and a protective layer forming solution applied to said film surface, wherein said protective layer forming solution is prepared by combining and mixing a mixed resin solution with a mixed solution; said mixed resin solution includes a fluororesin and an acrylic resin; said mixed solution includes a polyisocyanate prepolymer; and said protective layer forming solution is aged to form a two-liquid cross-linked film surface protective layer.

2. A photomask plate with a film surface protective layer, comprising:

a substrate;

a photomask plate photosensitive emulsion layer on said substrate; said photomask plate photosensitive emulsion layer being produced by forming a film surface of said photomask plate photosensitive emulsion layer on said substrate; and a protective layer forming solution applied to said film surface;

wherein said protective layer forming solution is prepared by mixing a main constituent comprising a two-liquid cross-linked antifouling surface coating agent with a cross-linking curing agent and a diluent;

said two-liquid cross linked antifouling surface coating agent is prepared by combining a mixed resin of a fluororesin and an acrylic resin in a solvent mixture of-butyl acetate, methyl ethyl ketone (MEK) and methyl isobutyl ketone (MIBK);

said cross-linking curing agent is prepared by mixing a polyisocyanate prepolymer and ethyl acetate;

said diluent comprises n-butyl acetate, methyl ethyl ketone (MEK) and cellosolve (ethylene glycol monoethyl ether) acetate; and said protective layer forming solution is then aged to form a two-liquid cross-linked film surface protective layer.

3. A photomask plate with a film surface protective layer, comprising:

a substrate;

a photomask plate photosensitive emulsion layer on said substrate;

said photomask plate photosensitive emulsion layer being produced by forming a film surface of said photomask plate photosensitive emulsion layer on said substrate; and a protective layer forming solution applied to said film surface, wherein said protective layer forming solution is prepared by mixing 25~50% of a main constituent, comprising a two-liquid cross-linked antifouling surface coating agent, with 1~6% of a cross-linking curing agent, and 46~75% of a diluent;

said two-liquid cross-linked antifouling surface coating agent is prepared by combining a mixed resin of a fluororesin and an acrylic resin in a solvent mixture of n-butyl acetate, methyl ethyl ketone (MEK) and methyl isobutyl ketone (MIBK);

said cross-linking curing agent is prepared by mixing a polyisocyanate prepolymer and ethyl acetate;

said diluent comprises n-butyl acetate, methyl ethyl ketone (MEK) and cellosolve (ethylene glycol monoethyl ether) acetate; and said protective layer forming solution is then aged to form a two-liquid cross-linked film surface protective layer.

4. The photomask plate with a film surface protective layer according to claim 3, wherein said substrate is a glass substrate.

5. The photomask plate with a film surface protective layer according to claim 2, wherein:

said two-liquid cross-linked antifouling surface coating agent is a mixed resin solution comprising a mixed resin of 5~20% of a fluororesin and 10~30% of an acrylic resin in a solvent mixture comprising 20~30% n-butyl acetate, 30~40% methyl ethyl ketone (MEK) and 5~10% methyl isobutyl ketone (MIBK);

said cross-linking curing agent is a mixed solution comprising 70~80% of a polyisocyanate prepolymer and 20~30% ethyl acetate; and said diluent is a mixed solution comprising 10~20% n-butyl acetate, 50~60% methyl ethyl ketone (MEK) and 25~40% cellosolve (ethylene glycol monoethyl ether) acetate.

6. The photomask plate with a film surface protective layer according to claim 3, wherein:

said two-liquid cross-linked antifouling surface coating agent is a mixed resin solution comprising a mixed resin of 5~20% of a fluororesin and 10~30% of an acrylic resin in a solvent mixture comprising 20~30% n-butyl acetate, 30~40% methyl ethyl ketone (MEK) and 5~10% methyl isobutyl ketone (MIBK); said cross-linking curing agent is a mixed solution comprising 70~80% of a polyisocyanate prepolymer and 20~30% ethyl acetate; and said diluent is a mixed solution comprising 10~20% n-butyl acetate, 50~60% methyl ethyl ketone (MEK) and 25~40% cellosolve (ethylene glycol monoethyl ether) acetate.

7. A method of manufacturing a photomask plate with a film surface protective layer, comprising:

preparing a two-liquid cross-linked antifouling surface coating agent by combining a mixed resin of a fluororesin and an acrylic resin in a solvent mixture of n-butyl acetate, methyl ethyl ketone (MEK) and methyl isobutyl ketone (MIBK);

preparing a cross-linking curing-agent by mixing a polyisocyanate prepolymer and ethyl acetate;

preparing a diluent of n-butyl acetate, methyl ethyl ketone (MEK) and cellosolve (ethylene glycol monoethyl ether) acetate;

mixing a main constituent comprising said two-liquid cross-linked antifouling surface coating agent with said cross-linking curing agent and said diluent to form a protective layer forming solution;

applying said protective layer forming solution to a photomask plate photosensitive emulsion layer; and aging said protective layer forming solution to form a film surface protective layer in a laminated manner.

8. The method of manufacturing a photomask plate with a film surface protective layer according to claim 7, wherein said photomask plate photosensitive emulsion layer is produced by preparing an emulsion photographic dry plate by forming the film surface of said photosensitive emulsion layer on a substrate, rendering a pattern, then carrying out development treatment.

9. A protective layer forming solution for a photomask plate, comprising:

a mixture of a two-liquid cross-linked antifouling surface coating agent, a cross-linking curing agent, and a diluent, wherein said two-liquid cross-linked antifouling surface coating agent is prepared by combining a mixed resin of a fluororesin and an acrylic resin in a solvent mixture of n-butyl, acetate, methyl ethyl ketone (MEK) and methyl isobutyl ketone (MIBK);

said cross-linking curing agent is prepared by mixing a polyisocyanate prepolymer and ethyl acetate; and said diluent comprises n-butyl acetate, methyl ethyl ketone (MEK) and cellosolve (ethylene glycol monoethyl ether) acetate.

10. A protective layer forming solution for a photomask plate comprising:

a two-liquid cross-linked antifouling surface coating agent being formed by combining a mixed resin of 5~20% of a fluororesin and 10~30% of an acrylic resin with a solvent mixture comprising 20~30% n-butyl acetate, 30~40% methyl ethyl ketone (MEK) and 5~10% methyl isobutyl ketone (MIBK);

a cross-linking curing agent comprising 70~80% of a polyisocyanate prepolymer and 20~30% ethyl acetate; and a diluent comprising 10~20% n-butyl acetate, 50~60% methyl ethyl ketone (MEK) and 25~40% cellosolve (ethylene glycol monoethyl ether) acetate;

wherein said protective layer forming solution is a mixture of 25~50% of said two-liquid cross-linked antifouling surface coating agent, 1~6% of said cross-linking curing agent, and 46~75% of said diluent.

* * * * *